United States Patent [19]

De La Plaza

[11] Patent Number: 4,695,751

[45] Date of Patent: Sep. 22, 1987

[54] SAMPLING-DATA INTEGRATOR WITH COMMUTATED CAPACITANCE UTILIZING A UNITARY-GAIN AMPLIFIER

[75] Inventor: Alejandro De La Plaza, Bergamo, Italy

[73] Assignee: SGS Microelettronica S.p.A., Italy

[21] Appl. No.: 926,590

[22] Filed: Nov. 4, 1986

[30] Foreign Application Priority Data

Nov. 8, 1985 [IT] Italy ............................... 22759 A/85

[51] Int. Cl.[4] ......................... H03K 5/01; G11C 27/02

[52] U.S. Cl. ..................................... 307/490; 307/246; 307/353; 307/491; 330/9

[58] Field of Search ............... 307/490, 491, 246, 353, 307/352; 328/128; 330/9

[56] References Cited

U.S. PATENT DOCUMENTS

| | | | |
|---|---|---|---|
| 4,352,069 | 9/1982 | Dessoulavy | 328/128 |
| 4,393,351 | 7/1983 | Gregorian et al. | 307/491 |
| 4,617,481 | 10/1986 | Masuda | 307/491 |

*Primary Examiner*—John Zazworsky

*Attorney, Agent, or Firm*—Gerald J. Ferguson, Jr.; Ronni S. Malamud; Michael P. Hoffman

[57] ABSTRACT

Four switches are controlled two by two by clock signal generators without overlapping in such a manner as to connect alternatively a sampling capacitor to an input signal source and in parallel to an integration capacitor between an input of a unitary-gain amplifier and ground.

2 Claims, 1 Drawing Figure

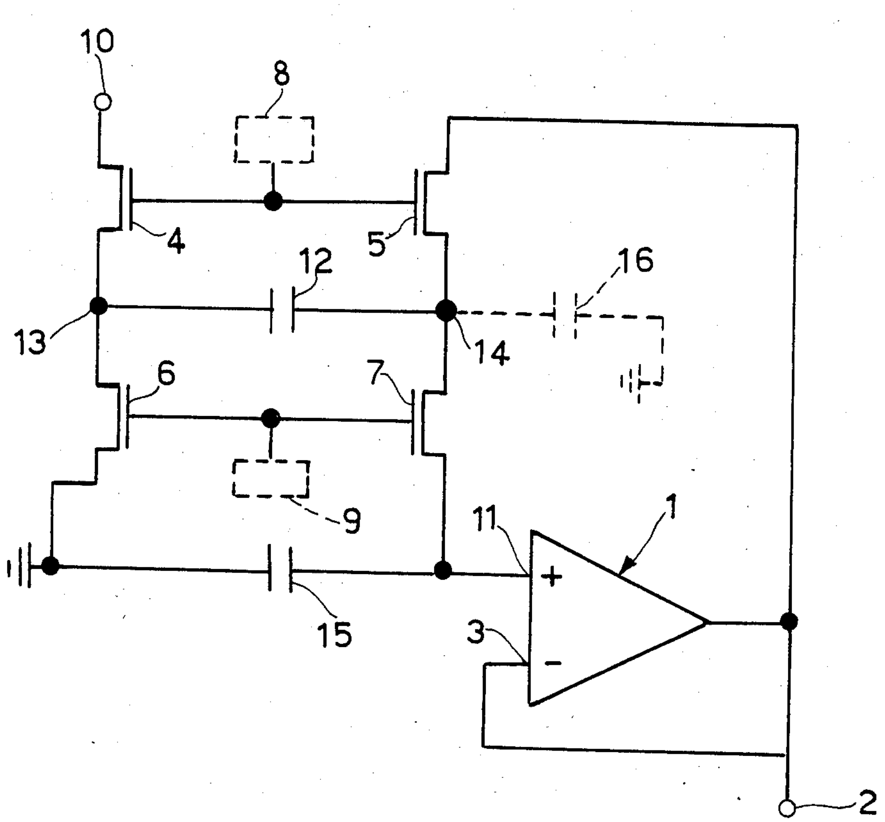
10
8
4
5
12
16
13
14
6
7
9
11
1
+
15
3
−
2

SAMPLING-DATA INTEGRATOR WITH COMMUTATED CAPACITANCE UTILIZING A UNITARY-GAIN AMPLIFIER

The present invention relates in general to a sampling-data integrator with commutated capacitance and more specifically to a commutated-capacitance integrator which uses a unitary-gain amplifier.

Sampling-data integrators with commutated capacitance include generally a sampling capacitor, an integration capacitor, an amplifier (buffer) with unitary gain and four switches in the form of MOS transistors. A first and second switch are controlled by a first timing or clock signal generator and a third and fourth switch are controlled by a second timing or clock signal generator synchronized with the first in such a manner that there are no overlapping signals. The first and third switches are connected in series between an input signal source and the amplifier output and the second and fourth switches are connected in series between ground and the positive input of the amplifier, which has its negative input connected to the output by a feedback lead. The sampling capacitor is connected between common circuit nodes between the first and third switches and between the second and fourth switches respectively. The integration capacitor is connected between the positive input of the amplifier and ground.

In these known integrators during a first operating phase in which the first timing or clock signal generator controls the first and second switches in a low resistance state and the second generator controls the third and fourth switches in a high resistance state the sampling capacitor charges at the input signal voltage while the integration capacitor remains charged steadily at the voltage established at the output of the amplifier in the course of the previous activity of the integrator. In the subsequent second phase of operation in which the first generator controls the first and second switches in a high resistance state, thus isolating the input source from the rest of the circuit, and the second generator controls the third and fourth switches in a low resistance state the entire charge stored in the sampling capacitor is distributed between said capacitor and the integration capacitor, the charging voltage of which, given the unitary gain of the amplifier, is again identical on the output of the amplifier.

Given the memorizing characteristics of the circuit, when the input signal ceases the output voltage of the amplifier should remain steady. But between each circuit node and ground there is in any physical construction a parasite capacitance which at each subsequent sequence of timing signals and specifically during the second phase described above tends to discharged the integration capacitor with resulting variation of the output voltage. This represents an undesirable limitation on widespred use of this type of commutated-capacitance integrator.

The object of the present invention is to accomplish a commutated-capacitance integrator with use as a unitary-gain amplifier which would be less sensitive to parasite capacitances.

Another object of the present invention is to accomplish an integrator of the abovesaid type which would have less sensitivity to parasite capacitances without introducing errors in the circuit transfer function.

In accordance with the invention said objects are achieved with a commutated-capacitance integrator comprising a sampling capacitor, an integration capacitor, a unitary-gain amplifier, and four switches commutatable between a low-resistance state and a high-resistance state, a first and a second switch being controlled by a first timing signal generator and a third and a fourth switch being controlled by a second timing signal generator synchronized with the first in such a manner that the related timing signals follow each other in sequence without overlapping, the first and the third switches being connected in series and the second and fourth switches being also connected in series, the sampling capacitor being connected between common circuit nodes between said switches in series, and the integration capacitor being connected between an input of the amplifier and ground, characterized in that the series of the first and third switches is inserted between an input signal source and ground and the series of the second and fourth switches is inserted between the amplifier output and said input of said amplifier.

Due to the effect of the new conformation of the integrator in accordance with the invention the parasite capacitance existing between the common node of the second and fourth swithces and ground is precharged during each first phase of the operating cycle at the amplifier output voltage, thus preventing in the subsequent second stage, even in the absence of the input signal, the discharge of the intergration capacitor (at that moment in parallel with the sampling capacitor) and hence variation of the output voltage. The other circuit node is grounded and hence free of parasite capacitance.

The integrator in accordance with the invention is thus essentially insensitive to parasite capacitances without introducing undesirable errors in the transfer function of the circuit.

The charateristics of the present invention will be made clearer by the following detailed description of a practical embodiment thereof illustrated in the single FIGURE of the annexed drawing.

In the drawing reference number 1 indicates a unitary-gain amplifier (buffer) with feedback from the output 2 to a negative input 3 thereof.

Reference numbers 4, 5, 6, and 7 indicate four switches made in the form of MOS transistors. A first and a second switch 4, 5 have their gates connected in common and subject to control of a first timing or clock signal generator 8. A third and a fourth switch 6, 7 also have their gates connected in common and subject to the control of a second timing or clock signal generator 9 synchronized with the generator 8 in such a manner that the related signals follow in sequence without overlapping.

The first and third switches are connected in series between an input signal source 10 and ground, and the second and fourth switches 5, 7 are connected in series between the output 2 of the amplifier 1 and a positive input 11 of said amplifier.

A sampling capacitor 12 is placed between two circuit nodes 13 and 14 which are placed between the switches 4, 6 and 5, 7 respectively.

An integration capacitor 15 is placed between the positive input 11 of the amplifier 1 and ground.

Due to the effect of the circuit conformation described, during a first phase of operation in which the generator 8 controls the switches 4, 5 in a low-resistance state and the generator 9 controls the switches 6, 7 in a high-resistance state, the sampling capacitor 12 charges at a voltage equal to the difference between the output voltage present on the output terminal 2 and the input voltage applied to the input terminal 10.

During this first phase the parasiste capacitance 16 existing between the circuit node 14 and ground, indicated in broken lines in the drawing, is precharged at the output voltage of the amplifier 1.

The abovesaid first phase is followed without overlapping of signals by a second operating phase in which the generator 8 controls the switches 4, 5 in a high-resistance state, thus isolating the input 10 from the rest of the circuit, while the generator 9 controls the swithces 6, 7 in a low-resistance state. In this condition a high-conductivity path connects in parallel the capacitors 12 and 15, originating a charge distribution between said capacitors. The output voltage on the terminal 2 then assumes a value dependent upon the total charge stored in the two capacitors.

During the abovesaid second phase, even without an input signal, the parasite capacitance 16 remains charged at the output voltage and thus does not bring about discharge of the two capacitors in parallel 12, 15. The output voltage on the terminal 2 thus remains steady for many timing cycles.

I claim:

1. Sampling-data integrator with commutated capacitances comprising a sampling capacitor, an integration capacitor, a unitary-gain amplifier and four switches commutatable between a low-resistance state and a high-resistance state, a first and a second switch being controlled by a first timing signal generator and a third and a fourth switch being controlled by a second timing signal generator synchronized with the first in such a manner that the related timing signals follow in sequence without overlapping, the first and the third switches being connected in series and the second and fourth switches being also connected in series, the sampling capacitor being connected between common circuit nodes placed between said switches in series and the integration capacitor being connected between an input of the amplifier and ground, characterized in that the series of the first and third switches is inserted between an input signal source and ground and the series of the second and fourth switches is inserted between the output of the amplifier and said input of said amplifier.

2. Integrator in accordance with claim 1 characterized in that said switches consist of MOS transistors.

* * * * *